United States Patent
Wu et al.

(10) Patent No.: US 7,732,289 B2
(45) Date of Patent: Jun. 8, 2010

(54) METHOD OF FORMING A MOS DEVICE WITH AN ADDITIONAL LAYER

(75) Inventors: Chii-Ming Wu, Taipei (TW); Chih-Wei Chang, Hsin-chu (TW); Pang-Yen Tsai, Jhu-bei (TW); Chih-Chien Chang, Yuan-Li Township, Miow-Li County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 289 days.

(21) Appl. No.: 11/174,683

(22) Filed: Jul. 5, 2005

(65) Prior Publication Data

US 2007/0010051 A1   Jan. 11, 2007

(51) Int. Cl.
*H01L 21/366* (2006.01)
(52) U.S. Cl. ............... 438/300; 438/482; 438/682; 257/E21.296; 257/E21.297; 257/E21.432
(58) Field of Classification Search ............ 438/682, 438/630, 649, 651, 479, 683–685, 300, 482, 438/483, FOR. 261; 257/E21.296, E21.297, 257/E21.431
See application file for complete search history.

(56) References Cited

U.S. PATENT DOCUMENTS

| | | | | |
|---|---|---|---|---|
| 5,710,450 A | * | 1/1998 | Chau et al. | 257/344 |
| 6,015,753 A | * | 1/2000 | Lin et al. | 438/682 |
| 6,077,750 A | * | 6/2000 | Sohn et al. | 438/303 |
| 6,100,145 A | * | 8/2000 | Kepler et al. | 438/300 |
| 6,165,900 A | * | 12/2000 | Kim et al. | 438/649 |
| 6,365,446 B1 | * | 4/2002 | Chong et al. | 438/197 |
| 6,387,803 B2 | * | 5/2002 | Talwar et al. | 438/682 |
| 6,518,155 B1 | * | 2/2003 | Chau et al. | 438/592 |
| 6,630,394 B2 | * | 10/2003 | Lu et al. | 438/197 |
| 6,674,135 B1 | * | 1/2004 | Cheek et al. | 257/408 |

(Continued)

FOREIGN PATENT DOCUMENTS

JP   56-50508   *   5/1981

(Continued)

OTHER PUBLICATIONS

Öztürk, M.C. et al., "Ultra-Shallow Source/Drain Junctions for Nanoscale CMOS Using Selective Silicon-Germanium Technology," Extended Abstracts of International Workshop on Junction Technology, 2001, pp. 77-82.

(Continued)

*Primary Examiner*—Matthew Smith
*Assistant Examiner*—Quovaunda Jefferson
(74) *Attorney, Agent, or Firm*—Slater & Matsil, L.L.P.

(57) ABSTRACT

A method of forming MOS devices is provided. The method includes providing a semiconductor substrate, forming a gate dielectric over the semiconductor substrate, forming a gate electrode over the gate dielectric, forming a source/drain region in the semiconductor substrate, forming an additional layer, preferably by epitaxial growth, on the source/drain region, and siliciding at least a top portion of the additional layer. The additional layer compensates for at least a portion of the semiconductor material lost during manufacturing processes and increases the distance between the source/drain silicide and the substrate. As a result, the leakage current is reduced. A transistor formed using the preferred embodiment preferably includes a silicide over the gate electrode wherein the silicide extends beyond a sidewall boundary of the gate electrode.

4 Claims, 5 Drawing Sheets

U.S. PATENT DOCUMENTS

| | | | |
|---|---|---|---|
| 7,390,707 B2 * | 6/2008 | Kawamura et al. | 438/197 |
| 2002/0037610 A1 * | 3/2002 | Tseng | 438/197 |
| 2002/0039830 A1 * | 4/2002 | Yeh et al. | 438/479 |
| 2003/0219971 A1 * | 11/2003 | Cabral et al. | 438/622 |
| 2004/0256671 A1 | 12/2004 | Huang et al. | |
| 2005/0082522 A1 * | 4/2005 | Huang et al. | 257/19 |
| 2005/0133834 A1 * | 6/2005 | Sorada et al. | 257/288 |
| 2008/0070370 A1 * | 3/2008 | Wu et al. | 438/301 |

OTHER PUBLICATIONS

Öztürk, M.C., et al., "Low Resistivity Nickel Germanosilicide Contacts to Ultra-Shallow $Si_{1-x}Ge_x$ Source/Drain Junctions for Nanoscale CMOS," IEDM, 2003, pp. 497-500.

Öztürk; M.C., et al., "Advanced $Si_{1-x}Ge_x$ Source/Drain and Contact Technologies for Sub-70 nm CMOS," IEDM, 2002, pp. 375-378.

"ULSI Technology", International Editions 1996, McGraw-Hill, p. 396.

\* cited by examiner

METHOD OF FORMING A MOS DEVICE WITH AN ADDITIONAL LAYER

TECHNICAL FIELD

This invention relates generally to the manufacture of semiconductor devices, and more particularly to the salicide process of forming source/drain regions of MOS devices.

BACKGROUND

Deep-submicron scaling required for VLSI systems dominates design considerations in the microelectronics industry. As the gate electrode length is scaled down, source and drain junctions must be scaled down accordingly to suppress the so-called short channel effects (SCE) that degrade the performance of miniaturized devices. A major problem related to complementary metal oxide silicon (CMOS) scaling is the undesirable increase in parasitic resistance. As the source/drain junction depth and polycrystalline silicon line width are scaled down into the deep-submicron range, parasitic series resistances of the source/drain diffusion layers and polysilicon gate electrodes increase. A conventional approach to counteract the increase in parasitic series resistances of the source/drain diffusion layers and the polysilicon gate electrodes involves salicide technology which comprises forming a layer of metal silicide on the source/drain regions and the gate electrode.

Conventional salicide technology for reducing parasitic series resistance has proven problematic, particularly as design rules plunge into the deep-submicron range, i.e., about 0.18 microns and smaller. For example, agglomeration causes silicide to have high sheet resistance. Due to the scaling, the silicide integrity becomes worse when the line width is narrowed. Silicide is prone to agglomeration. With a wide line width, if a portion of the silicide agglomerates, more alternative paths still exist for currents. However, with a narrow line width, an agglomerated portion may occupy a greater portion of a cross sectional area on the current path, thus the sheet resistance will increase significantly with an agglomeration. Therefore sheet resistance tailing occurs, which means that there is a higher probability that a silicide has high sheet resistance.

It can be appreciated from the geometry of a MOS device that smaller device sizes, in particular a shorter distance between the source and drain, will allow the conducting channel between the source and drain to form more rapidly and allow the device to operate at higher switching speeds. As the device dimensions are reduced to achieve higher packing densities and improved performance, the junction depth needs to be scaled in proportion to the junction length. However, the formation of silicide consumes crystalline silicon from the underlying semiconductor substrate. When the junction depth is significantly smaller than the thickness of the silicide, the thickness variation of the silicide caused by process variations may be greater than the junction depth, making the junction depth very hard to control.

Another significant problem is leakage current. FIG. 1 illustrates a conventional transistor. The source/drain region includes a lightly doped source/drain region (LDD) 104 and a deep source/drain region 106. Silicide 102 typically consumes a portion of the deep source/drain region 106, thus lowering the top surface of the deep source/drain region 106. As a result, the silicide 102 is closer to a corner point 108, which is located at an interface of the LDD region 104 and the deep source/drain region 106. When the transistor is scaled down, the distance D decreases, and a leakage current between the silicide 102 and the substrate 2, as is symbolized by arrow 110, increases. With continued scaling of the MOS devices, the distance D will continue to decrease, causing an increase in the leakage current. If processes are not well controlled, silicide 102 may become very close to, or even reach, point 108, causing a significant leakage current.

Accordingly, there exists a need for a simplified methodology for forming low resistance contacts in semiconductor devices with increased reliability and reduced junction leakage.

SUMMARY OF THE INVENTION

The preferred embodiments of the present invention provide a method of forming MOS devices that have low leakage current from source/drain silicides to the substrate.

In accordance with a preferred embodiment of the present invention, the method includes providing a semiconductor substrate, forming a gate dielectric over the semiconductor substrate, forming a gate electrode over the gate dielectric, forming a lightly doped source/drain (LDD) region and a deep source/drain region in the semiconductor substrate, forming an additional layer, preferably by epitaxial growth, on the exposed deep source/drain region, and siliciding at least a top portion of the additional layer.

In accordance with another preferred embodiment of the present invention, a transistor formed using the preferred embodiment preferably includes a gate dielectric over a semiconductor substrate, a gate electrode over the gate dielectric, a source/drain region substantially aligned with a sidewall of the gate electrode in the substrate, and a silicide layer on the source/drain region wherein the silicide is a product of siliciding an additional layer grown on the source/drain region. The transistor further includes a silicide layer over the gate electrode, wherein the silicide layer has an extended portion extending substantially beyond a sidewall boundary of the gate electrode. Preferably, the source/drain region includes a lightly doped source/drain (LDD) region substantially aligned with the sidewall of the gate electrode and a deep source/drain region that is further away from the gate electrode than the LDD region.

By using the preferred embodiments of the present invention, the additional (epitaxy) layer compensates for at least a portion of the semiconductor material lost during manufacturing processes. The additional layer also increases the distance between the source/drain silicide and the substrate. As a result, the leakage current is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of forming a MOS device is discussed in subsequent paragraphs. The intermediate stages for manufacturing preferred embodiments of the present invention are illustrated. Throughout the various views and illustrative embodiments of the present invention, like reference numbers are used to designate like elements.

Figure 1:
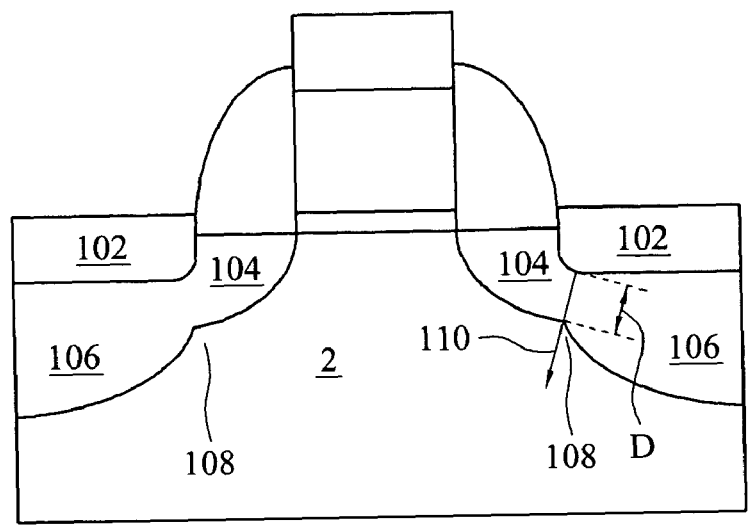
FIG. 1 illustrates a schematic view of a leakage current between a source/drain silicide and its respective substrate.
Figure 2:
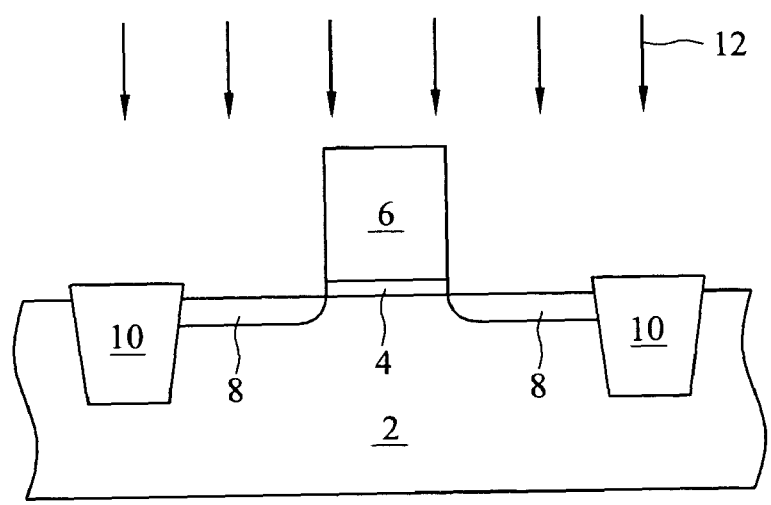
FIGS. 2 through 7 are cross-sectional views of intermediate stages in the manufacture of a MOS transistor embodiment.

FIG. 2 illustrates the formation of shallow trench isolations (STI) 10 and a gate structure in substrate 2. In the preferred embodiment, substrate 2 is a silicon substrate. In other embodiments, substrate 2 comprises SiGe. In yet other embodiments, bulk semiconductor, strained semiconductor, compound semiconductor, multi-layer semiconductor or silicon on insulator (SOI), strained silicon-on-insulator (SSOI), strained silicon germanium on insulator (S—SiGeOI), and silicon germanium on insulator (SiGeOI) can be used for substrate 2. STIs 10 are formed in the substrate 2. Preferably, STIs 10 are formed by etching shallow trenches in the substrate 2 and filling the trenches with an insulator such as silicon oxide.

A gate dielectric 4 is formed on the surface of substrate 2. The gate dielectric 4 is preferably oxide. The forming method can be any of the known methods, such as local oxidation of silicon (LOCOS), chemical vapor deposition (CVD), etc. Silicon nitride can also be used since it is an effective barrier for impurity diffusion. The silicon nitride film is preferably formed by thermal nitridation of silicon. It can also be prepared by plasma anodic nitridation using nitrogen-hydrogen or thermal nitridation of $SiO_2$. The gate dielectric 4 may also be oxynitride, oxygen-containing dielectrics, nitrogen-containing dielectrics, high-k materials, or combinations thereof.

A gate electrode 6 is formed on the gate dielectric 4. In the preferred embodiment, the gate electrode 6 is polysilicon or SiGe, although it may be formed of metal, or a compound structure including metal, semiconductor, metal oxide, silicide, and the like. The preferred method of formation is CVD, although other known methods can also be used. The polysilicon or SiGe gate electrode 6 is then doped to reduce sheet resistance. In other embodiments, gate electrode 6 may comprise amorphous silicon, elemental metals that are conductive, alloys of elemental metals that are conductive, silicides or nitrides of elemental metals that are conductive, or combinations thereof. Typically, the gate dielectric 4 and the gate electrode 6 are deposited as layers and then patterned.

FIG. 2 also illustrates the formation of lightly doped drain/source (LDD) regions 8. Preferably, LDD regions 8 are formed by implanting appropriate types of impurities, as is symbolized by arrows 12, into the substrate 2 using gate electrode 6 as a mask.

Figure 3:
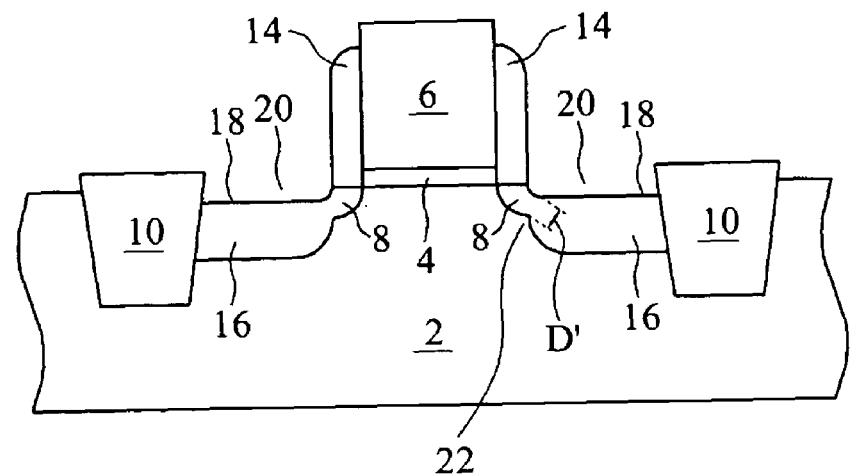

FIG. 3 illustrates the formation of spacers 14 and deep source/drain regions 16. A pair of spacers 14 is formed along sidewalls of the gate dielectric 4 and gate electrode 6. As known in the art, spacers 14 are preferably formed by blanket depositing a dielectric layer, then anisotropically etching to remove the dielectric material from horizontal surfaces thereby leaving spacers 14.

Due to process reasons, such as acid use for removing undesired dielectric portions or subsequent cleaning processes, exposed silicon surfaces 18 are typically recessed, and recesses 20 are formed. The distance D' between the recessed surface 18 and substrate 2 is thus decreased. A subsequent salicide process, which consumes a top portion of the deep source/drain regions 16, will further reduce the distance D'. The leakage current, which flows between the subsequently formed silicide and the substrate 2, is related to the distance D', and the lower the distance D' is, the lower the distance between the bottom of the subsequently formed silicide to point 22, and thus the higher the leakage current is.

In the preferred embodiment, deep source/drain regions 16 are formed by implanting impurities into the semiconductor substrate 2. The impurity concentration in deep source/drain regions 16 is preferably greater than the concentration in LDD regions 8. Spacers 14 are used as masks so that edges of the deep source/drain regions 16 are substantially aligned with the spacer 14. The gate electrode 6 is preferably implanted simultaneously to reduce sheet resistance.

Figure 4A:
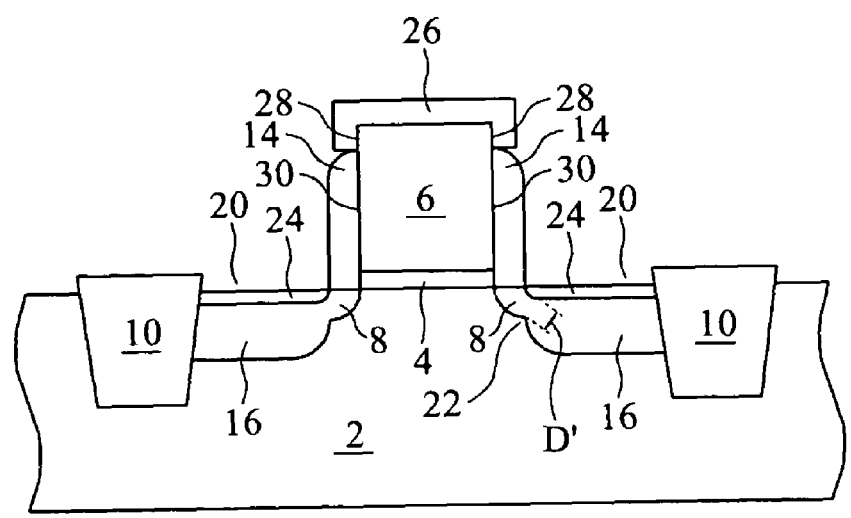
Figure 4B:
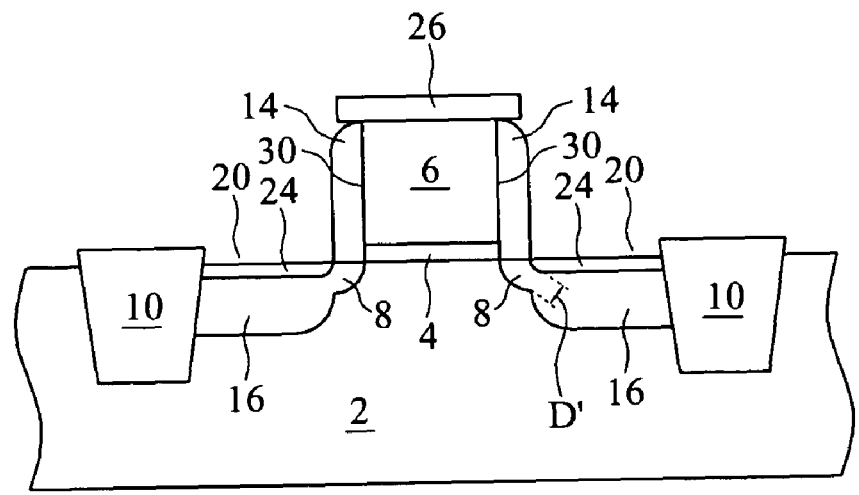

A thin layer of semiconductor material 24 is selectively formed, for example, epitaxially grown on deep source/drain regions 16, as shown in FIGS. 4A and 4B, and is referred to as additional layer 24. In the preferred embodiment, the material of the additional layer 24 is preferably the same as the semiconductor material in deep source/drain regions 16. In alternative embodiment, however, different materials can be used, although materials with similar characteristics to the deep source/drain region material are preferred. By controlling epitaxy process parameters, such as temperature and composition of precursors, the additional layer 24 can be formed selectively on the deep source/drain regions 16, and preferably on gate electrode 6. The additional layer 24 increases the distance between substrate 2 and the bottom interface of the subsequently formed silicide. As a result, the leakage current is reduced. The additional layer 24 compensates, at least partially, for the semiconductor material lost during previously discussed processes. In FIG. 4A, the additional layer 24 compensates for only a portion of the semiconductor material lost, so that the top surface of the additional layer 24 is lower than the top interface of the channel region. However, the additional layer 24 can have a thickness equal to or greater than the depth of recesses 20 (not shown), causing the surface of the additional layer 24 to be level with or higher than the top interface of the channel region.

In the preferred embodiment, the additional layer 24 is not doped and will be completely consumed in the subsequent salicide process. In this case, the additional layer 24 can be blanket deposited using methods other than epitaxially growing. Although the additional layer 24 blanket deposited does not have crystal structure, it will be fully silicided. In alternative embodiments, additional layer 24 has a remaining portion unsilicided. Care has to be taken, however, so that the remaining portion has a high impurity concentration. This can be done by epitaxially growing the additional layer 24 with impurities, or performing an additional impurity implantation after the epitaxy process.

At the time the additional layer 24 is formed on the deep source/drain regions 16, a layer 26 is formed on the gate electrode 6, and is referred to herein as additional gate layer 26. If gate electrode 6 is formed of polysilicon, the additional gate layer 26 is typically polysilicon. The additional gate layer 26 may have an amorphous structure if the gate electrode 6 is formed of metal, silicides, etc. Typically, when the spacers 14 are formed, a top portion of the spacers 14 will be removed, causing the top surfaces of the spacers 14 to be lower than the top surface of the gate electrode 6. The additional gate layer 26 will also grow on exposed sidewalls 28 of the gate electrode 6, thus a hat-like structure is formed, as shown in FIG. 4A, where the additional gate layer 26 grows out beyond the sidewall boundaries 30 of the gate electrode 6. In case the top surface of the gate electrode 6 is level with the top surfaces of the gate spacers 14, as shown in FIG. 4B, the newly formed additional gate layer 26 will grow vertically and horizontally once its top surface is higher than the top surface of the gate spacers 14, and the additional gate layer 26 will grow beyond the boundaries 30 of the gate electrode 6.

When determining an optimum thickness of the additional layer 24, at least two factors have to be taken into account. First, the increased amount of the distance D' needs to be a noticeable portion of the total distance D', so that the reduction of the leakage current will be significant enough to justify the additional process step. Second, the distance D' should not be increased too much as to compromise the shallow junction characteristics. One skilled in the art can find the optimum thickness of the additional layer 24 through routine experiments. In the preferred embodiment, the thickness is less than about 100 Å, and more preferably between about 30 Å and about 100 Å.

Figure 5:
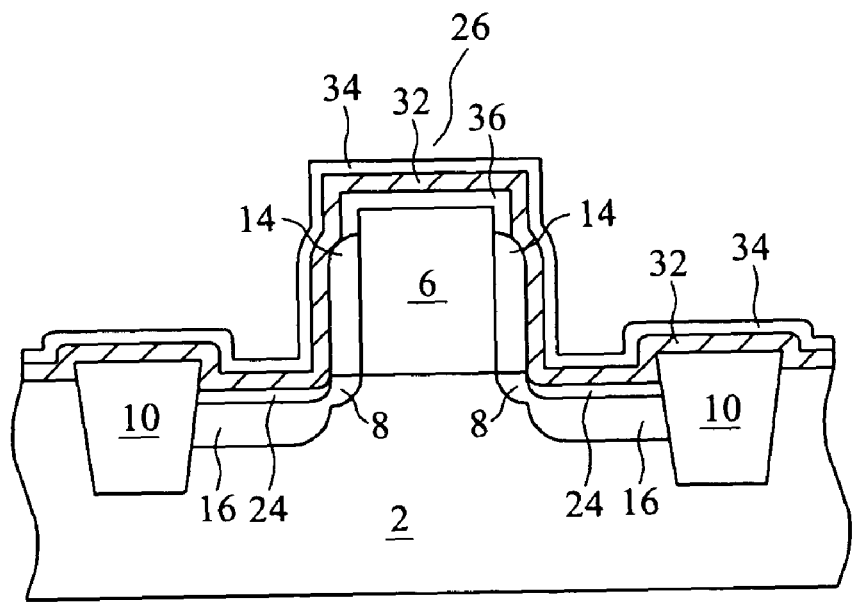

FIG. 5 illustrates the deposition of a metal layer 32 and a reactive capping layer 34 over the additional layer 24 and the additional gate layer 26. The thin layer of metal 32, preferably formed of Nickel (Ni) or Cobalt (Co), is blanket deposited. The metal layer 32 can be deposited using plasma vapor deposition (PVD), evaporation, or other known methods. Metal layer 32 has a preferred thickness of less than about 200 Å, and more preferably between about 50 Å and about 120 Å.

A reactive capping layer 34 is formed on the metal layer 32. Reactive capping layer 34 has the function of isolating the metal layer 32 from external environmental variables such as oxygen. Layer 34 can also be deposited by plasma vapor deposition (PVD), evaporation, or other known methods. In the preferred embodiment, the reactive capping layer 34 comprises TiN. The thickness of the reactive capping layer 34 is preferably between about 20 Å and about 300 Å, and more preferably between about 25 Å and about 150 Å. After an annealing process to form silicide regions, a selective etch is preformed to remove undesired portions and leave silicide regions. An optional second annealing process may be performed to transit the silicide regions to a low resistance phase.

Figure 6A:
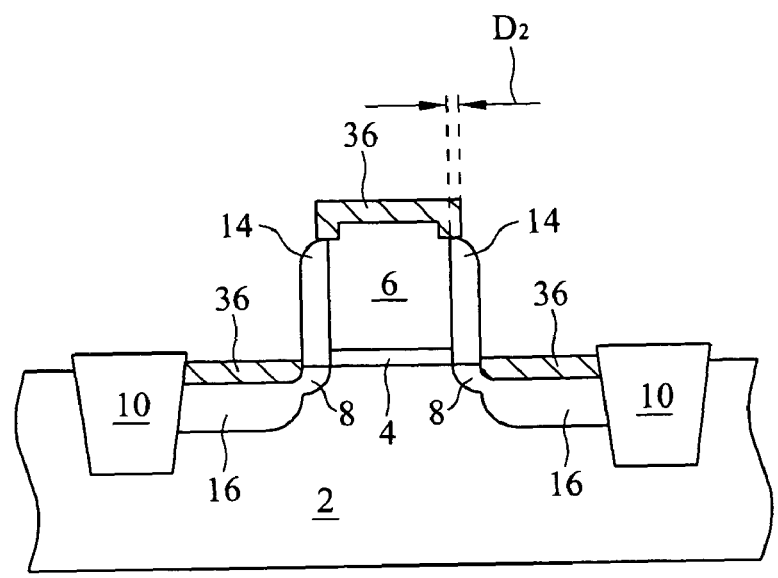
Figure 6B:
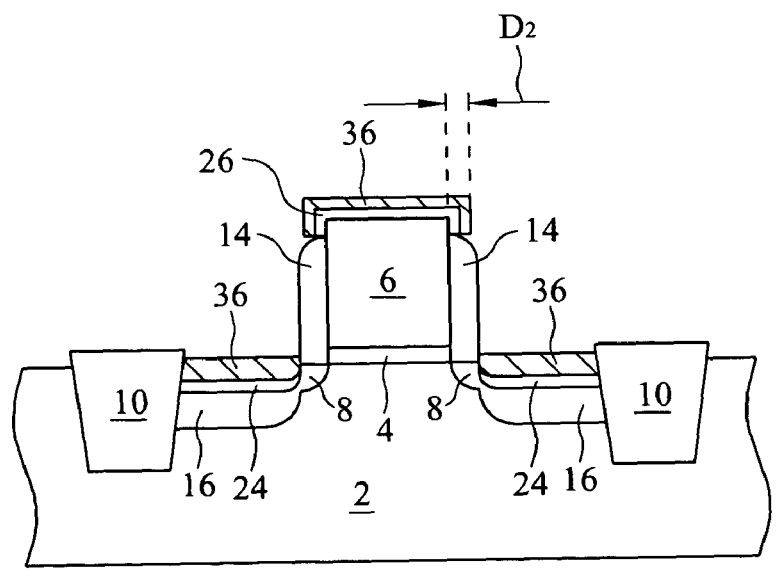

FIGS. 6A and 6B illustrate the formation of silicide regions on the deep source/drain regions 16 and the gate electrode 6. When annealed, metal layer 32 reacts with the underlying material and a silicide layer 36 is formed. The silicide layer 36 is preferably less than about 400 Å, and more preferably between about 150 Å and about 350 Å. Preferably, the annealing temperature is preferably between about 250° C. and about 600° C., more preferably between about 300° C. and 550° C., so that less high-resistivity silicide, such as $NiSi_2$ is formed. In the preferred embodiment, the salicide process fully consumes the additional layer 24 and the additional gate layer 26, resulting in a structure as shown in FIG. 6A. In alternative embodiments, a bottom portion of the additional layer 24 and the additional gate layer 26 remains unsilicided, as illustrated in FIG. 6B. The reactive capping layer 34 and unsilicided portion of the metal layer 32 are then removed.

With regard to the silicide layer 36 formed on the gate electrode, as shown in FIGS. 6A and 6B, since the additional gate layer 26 extends substantially beyond boundaries 30, the resulting silicide layer 36 also extends substantially beyond the boundaries 30. In the preferred embodiment, the extended portion has a width $D_2$ of greater than about 10 Å, and more preferably between about 30 Å and about 50 Å. However, in typical cases, due to the effects of the source/drain implant process, the shape of the poly gate is not rectangular, thus $D_2$ may be different if measured using different methods.

Figure 7:
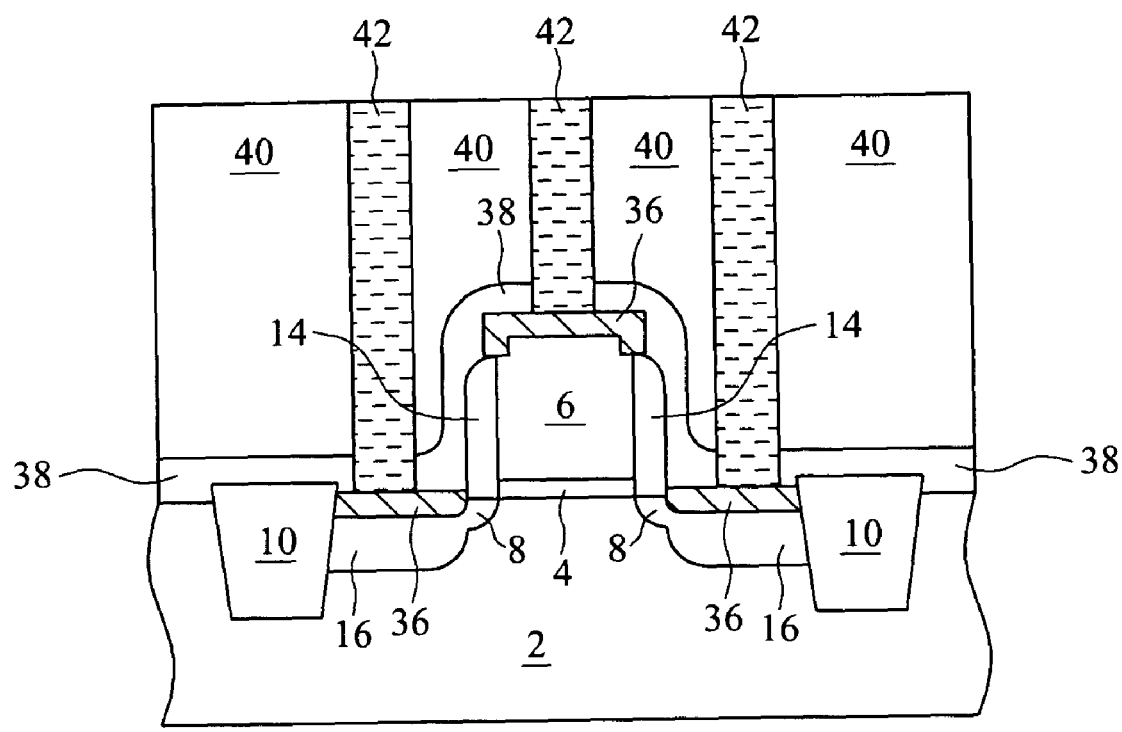

FIG. 7 illustrates the formation of an (contact) etch stop layer (ESL) 38, an inter-layer dielectric (ILD) layer 40, and contact plugs 42. ESL 38 is blanket deposited to cover the entire structure formed by previously discussed steps. This layer typically serves two purposes. First, it provides a stress to the device and enhances carrier mobility. Second, it acts as an etch stop layer to protect underlying regions from being over etched. Next, an ILD layer 40 is deposited on the ESL 38. Contact plugs 42 are then made through the ILD layer 40.

By forming the additional layer 24, the silicon consumption during the salicide process is reduced. Source/drain silicide layer 36 can have a desired thickness without the cost of shortening the distance between the silicide 36 and the substrate 2. As a result, the leakage current is controlled. The resulting silicides have sufficient thickness so that an agglomeration portion in silicide layer 36 has less probability of occupying a major portion of a cross sectional area on the current path, and thus the sheet resistance tailing problem is substantially reduced.

The effects of the preferred embodiments of the present invention have been revealed by experiment results, which have shown that sample devices having no additional layer may have significant tailing effects with a significant number of samples having great sheet resistance. However, if a 50 Å to 100 Å additional layer is formed, the majority of the sample devices have low sheet resistances, and much fewer sample devices have high sheet resistances.

Leakage currents are also measured on sample devices with and without additional layers. The results have shown that samples devices with no additional layer have a higher probability of having greater leakage current than the sample devices having a 50 Å additional layer or a 100 Å additional layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a MOS device comprising:
   providing a semiconductor substrate having a top surface;
   forming a gate dielectric over the semiconductor substrate;
   forming a gate electrode over the gate dielectric;
   forming a source/drain region in the semiconductor substrate;
   after the step of forming the source/drain region, depositing an amorphous silicon layer on the source/drain region, wherein the amorphous silicon layer and the source/drain region have an interface with at least a portion lower than the top surface;
   depositing a metal layer on the amorphous silicon layer; and
   reacting the amorphous silicon layer and the metal layer to form a silicide, wherein the amorphous silicon layer is fully reacted.

2. The method of claim 1, wherein the amorphous silicon layer has a thickness of less than about 100 Å.

3. The method of claim 1, wherein the step of depositing the amorphous silicon layer comprises in-situ doping the amorphous silicon layer.

4. The method of claim 1, wherein the source/drain region is a source region, wherein a portion of the amorphous silicon layer on the source region and a portion of the amorphous silicon layer on a drain region are disconnected from each other.

* * * * *